US012615992B2

(12) United States Patent
Suzuki et al.

(10) Patent No.: US 12,615,992 B2
(45) Date of Patent: Apr. 28, 2026

(54) SUBSTRATE TRANSPORT METHOD AND SUBSTRATE PROCESSING SYSTEM

(71) Applicant: Tokyo Electron Limited, Tokyo (JP)

(72) Inventors: Kiyoshi Suzuki, Yamanashi (JP); Hiroshi Hirose, Yamanashi (JP); Ryota Goto, Yamanashi (JP); Koichi Miyashita, Yamanashi (JP)

(73) Assignee: Tokyo Electron Limited, Tokyo (JP)

(*) Notice: Subject to any disclaimer, the term of this patent is extended or adjusted under 35 U.S.C. 154(b) by 689 days.

(21) Appl. No.: 18/153,469

(22) Filed: Jan. 12, 2023

(65) Prior Publication Data

US 2023/0230862 A1 Jul. 20, 2023

(30) Foreign Application Priority Data

Jan. 17, 2022 (JP) ................................. 2022-005290

(51) Int. Cl.
*H01L 21/67* (2006.01)
*H01L 21/677* (2006.01)
*H01L 21/683* (2006.01)

(52) U.S. Cl.
CPC .... *H01L 21/67201* (2013.01); *H01L 21/6719* (2013.01); *H01L 21/67259* (2013.01); *H01L 21/67742* (2013.01); *H01L 21/67745* (2013.01); *H01L 21/6838* (2013.01)

(58) Field of Classification Search
CPC ........... H01L 21/67201; H01L 21/6719; H01L 21/67259; H01L 21/67742; H01L 21/67745; H01L 21/6838; H01L 21/67196; H01L 21/67276; H01L 21/67161;

(Continued)

(56) References Cited

U.S. PATENT DOCUMENTS 5,563,798 A * 10/1996 Berken ................. H01L 21/681
414/935
5,980,194 A * 11/1999 Freerks ................... H01L 21/68
414/754

(Continued)

FOREIGN PATENT DOCUMENTS

JP 2009-94530 4/2009
JP 2020-61472 4/2020
KR 10-2020-0040682 4/2020

*Primary Examiner* — Michael Collins
(74) *Attorney, Agent, or Firm* — IPUSA, PLLC

(57) ABSTRACT

A substrate transport method is employed in a substrate processing system including a plurality of processing chambers, a load lock chamber, a vacuum transport device provided in a vacuum transport chamber connecting the load lock chamber and the plurality of processing chambers and configured to simultaneously transport a plurality of substrates, and an atmospheric transport device provided in an atmospheric transport chamber and configured to transport a substrate from a carrier to the load lock chamber. The substrate transport method includes acquiring in advance a relative positional error for a case where the plurality of substrates are transported from the load lock chamber to the plurality of processing chambers and placed on a stage in the plurality of processing chambers, and placing the plurality of substrates on a stage in the load lock chamber, based on a transport path of the plurality of substrates and the relative positional error.

9 Claims, 5 Drawing Sheets

(58) Field of Classification Search
  CPC ......... H01L 21/67739; H01L 21/67167; H01L
                  21/67766
  See application file for complete search history.

(56)         References Cited

U.S. PATENT DOCUMENTS

| | | | | |
|---|---|---|---|---|
| 6,748,293 | B1 * | 6/2004 | Larsen .................. | H01L 21/681 |
| | | | | 414/811 |
| 7,281,741 | B2 * | 10/2007 | Woodruff .......... | H01L 21/67259 |
| | | | | 414/744.8 |
| 10,134,623 | B2 * | 11/2018 | Yin ................... | H01L 21/68707 |
| 10,586,729 | B2 * | 3/2020 | Koizumi ............ | H01L 21/6831 |
| 11,996,306 | B2 * | 5/2024 | Yamagishi ........ | H01L 21/67742 |
| 2005/0137751 | A1 * | 6/2005 | Cox .................. | H01L 21/67259 |
| | | | | 700/254 |
| 2008/0142733 | A1 * | 6/2008 | Zywno ................... | H01J 37/20 |
| | | | | 250/491.1 |
| 2016/0040288 | A1 * | 2/2016 | Wu ........................ | C23C 16/46 |
| | | | | 427/255.28 |
| 2017/0004992 | A1 * | 1/2017 | Koizumi ........... | H01L 21/67742 |
| 2023/0054858 | A1 * | 2/2023 | Zheng .............. | H01L 21/67265 |

* cited by examiner

FIG.3

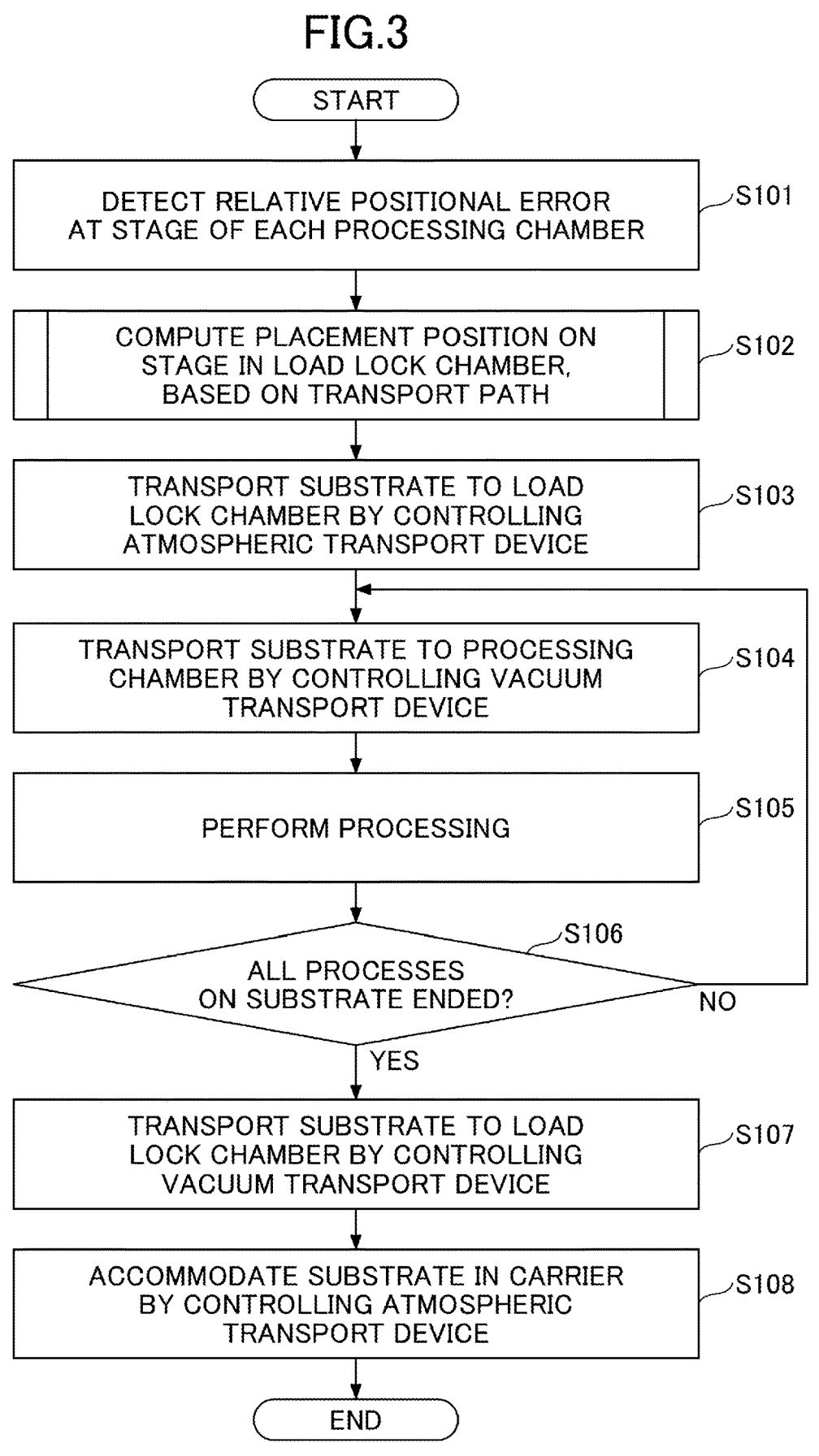

START

DETECT RELATIVE POSITIONAL ERROR AT STAGE OF EACH PROCESSING CHAMBER — S101

COMPUTE PLACEMENT POSITION ON STAGE IN LOAD LOCK CHAMBER, BASED ON TRANSPORT PATH — S102

TRANSPORT SUBSTRATE TO LOAD LOCK CHAMBER BY CONTROLLING ATMOSPHERIC TRANSPORT DEVICE — S103

TRANSPORT SUBSTRATE TO PROCESSING CHAMBER BY CONTROLLING VACUUM TRANSPORT DEVICE — S104

PERFORM PROCESSING — S105

ALL PROCESSES ON SUBSTRATE ENDED? — S106

NO

YES

TRANSPORT SUBSTRATE TO LOAD LOCK CHAMBER BY CONTROLLING VACUUM TRANSPORT DEVICE — S107

ACCOMMODATE SUBSTRATE IN CARRIER BY CONTROLLING ATMOSPHERIC TRANSPORT DEVICE — S108

END

FIG.4

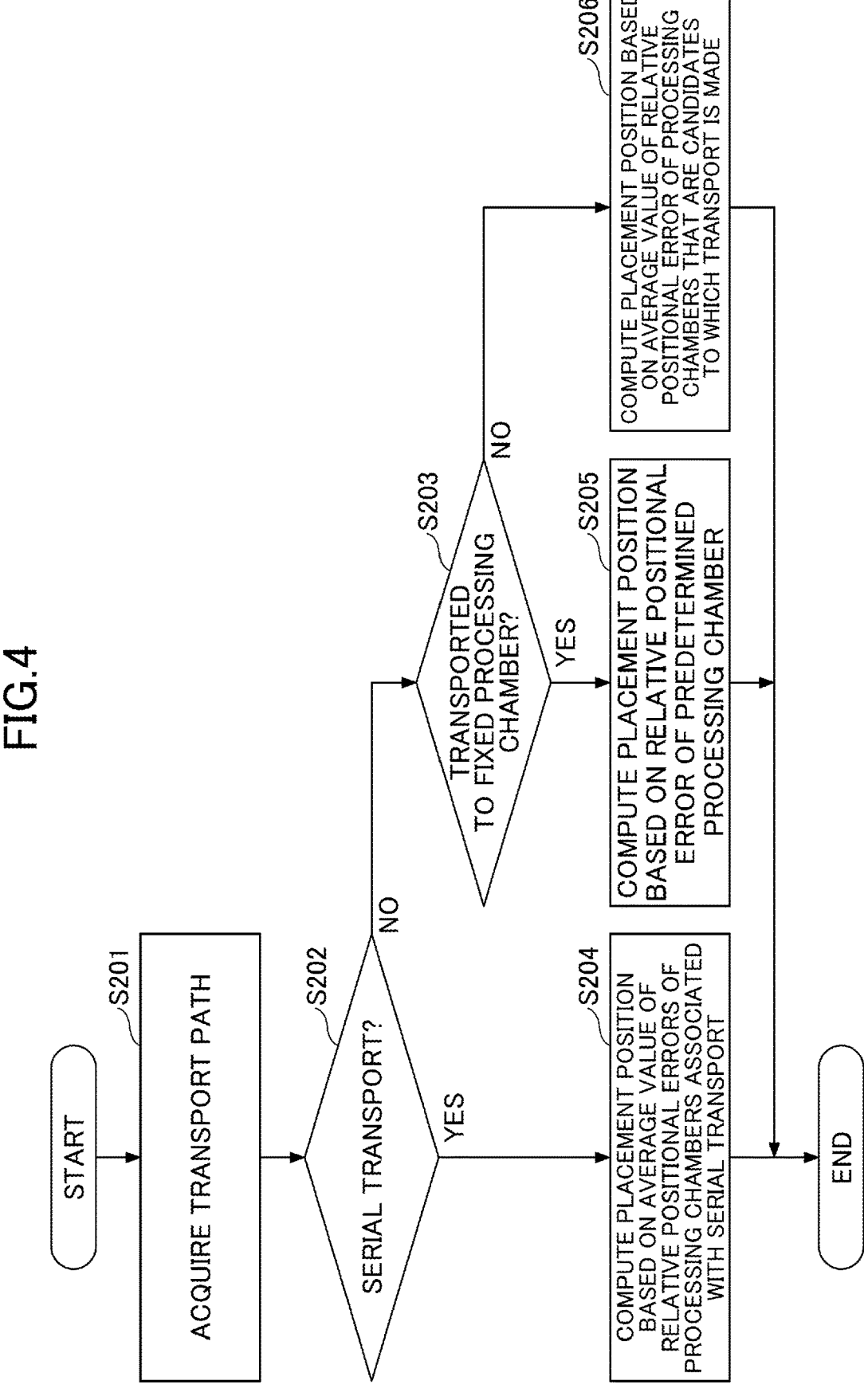

START

S201
ACQUIRE TRANSPORT PATH

S202
SERIAL TRANSPORT?

YES

S204
COMPUTE PLACEMENT POSITION BASED ON AVERAGE VALUE OF RELATIVE POSITIONAL ERRORS OF PROCESSING CHAMBERS ASSOCIATED WITH SERIAL TRANSPORT

NO

S203
TRANSPORTED TO FIXED PROCESSING CHAMBER?

YES

S205
COMPUTE PLACEMENT POSITION BASED ON RELATIVE POSITIONAL ERROR OF PREDETERMINED PROCESSING CHAMBER

NO

S206
COMPUTE PLACEMENT POSITION BASED ON AVERAGE VALUE OF RELATIVE POSITIONAL ERROR OF PROCESSING CHAMBERS THAT ARE CANDIDATES TO WHICH TRANSPORT IS MADE

END

FIG.5

| | X | Y | Z |
|---|---|---|---|
| STAGE 133<br>(FOR PROCESSING CHAMBER 110A) | $A_{31}$ | $B_{31}$ | $C_{31}$ |
| STAGE 133<br>(FOR PROCESSING CHAMBER 110C) | $A_{32}$ | $B_{32}$ | $C_{32}$ |
| STAGE 133<br>(FOR PROCESSING CHAMBER 110E) | $A_{33}$ | $B_{33}$ | $C_{33}$ |
| STAGE 134<br>(FOR PROCESSING CHAMBER 110B) | $A_{41}$ | $B_{41}$ | $C_{41}$ |
| STAGE 134<br>(FOR PROCESSING CHAMBER 110D) | $A_{42}$ | $B_{42}$ | $C_{42}$ |
| STAGE 134<br>(FOR PROCESSING CHAMBER 110F) | $A_{43}$ | $B_{43}$ | $C_{43}$ |

SUBSTRATE TRANSPORT METHOD AND SUBSTRATE PROCESSING SYSTEM

CROSS-REFERENCE TO RELATED APPLICATIONS

This application is based upon and claims priority to Japanese Patent Application No. 2022-005290, filed on Jan. 17, 2022, the entire contents of which are incorporated herein by reference.

BACKGROUND

1. Field of the Invention

The present disclosure relates to substrate transport methods, and substrate processing systems.

2. Description of the Related Art

For example, Japanese Laid-Open Patent Publication No. 2009-94530 proposes a wafer processing apparatus including a load lock chamber that simultaneously processes two wafers, a transfer chamber, and a processing chamber.

For example, Japanese Laid-Open Patent Publication No. 2020-61472 proposes a transport device that simultaneously transports a plurality of substrates from a transport chamber to a processing chamber.

SUMMARY

One aspect of the present disclosure provides a substrate transport method and a substrate processing system including a transport device configured to simultaneously transport a plurality of substrates, which transport the plurality of substrates while correcting a positional error of the plurality of substrates.

According to one aspect of the present disclosure, a substrate transport method for a substrate processing system including a plurality of processing chambers, a load lock chamber, a vacuum transport device provided in a vacuum transport chamber connecting the load lock chamber and the plurality of processing chambers and configured to simultaneously transport a plurality of substrates, and an atmospheric transport device provided in an atmospheric transport chamber and configured to transport a substrate from a carrier to the load lock chamber, includes acquiring in advance a relative positional error for a case where the plurality of substrates are transported from the load lock chamber to the plurality of processing chambers and placed on a stage in the plurality of processing chambers; and placing the plurality of substrates on a stage in the load lock chamber, based on a transport path of the plurality of substrates and the relative positional error.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF THE DRAWINGS

FIG. 3 is a flow chart for explaining an example of an operation of the substrate processing system;

FIG. 4 is a flow chart for explaining an example of an operation of the substrate processing system; and FIG. 5 is a diagram illustrating an example of a table stored in a controller.

DETAILED DESCRIPTION

Figure 1:
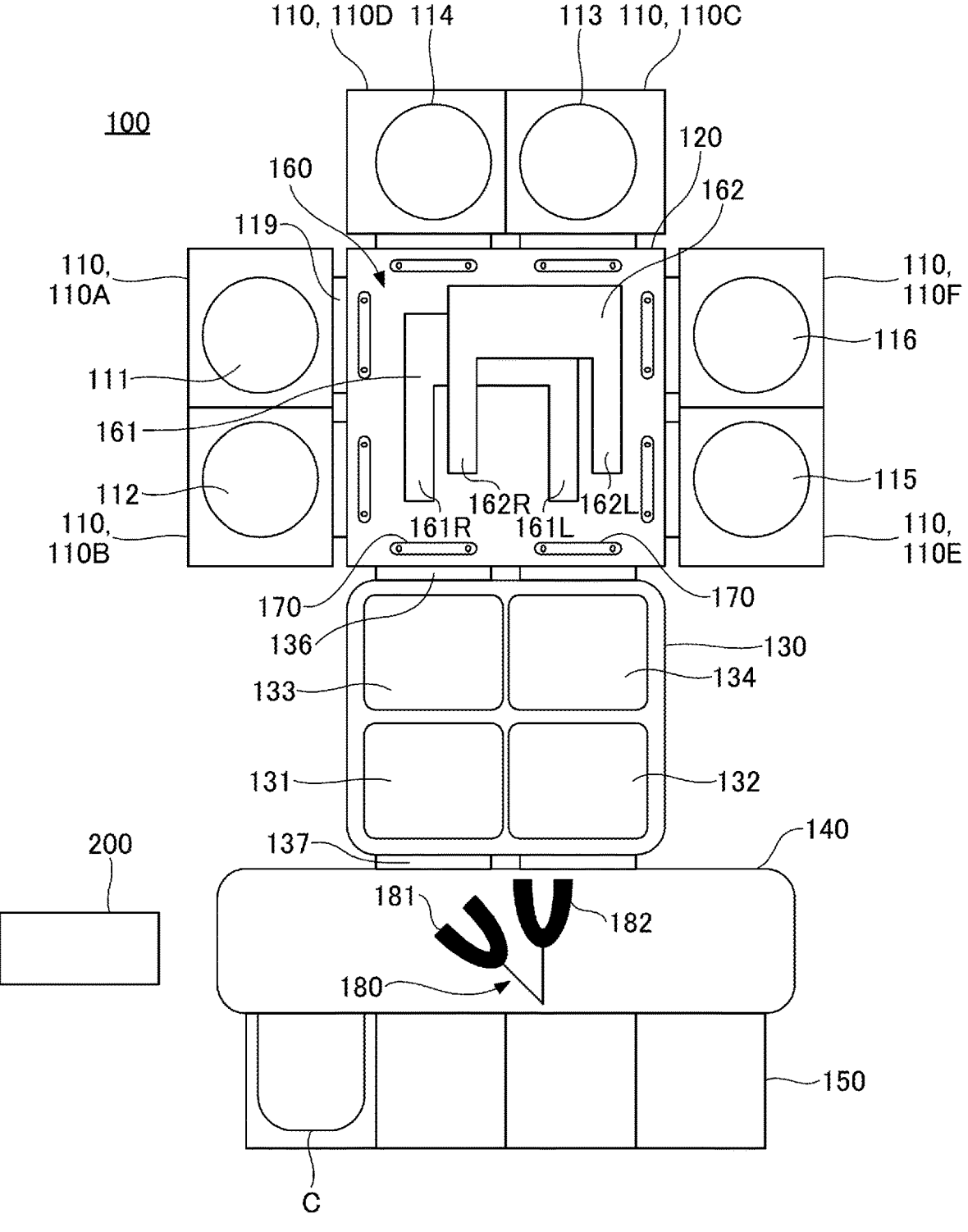
FIG. 1 is a plan view illustrating a configuration of an example of a substrate processing system according to one embodiment.

Hereinafter, embodiments of the present disclosure will be described with reference to the drawings. In the drawings, the same constituent elements are designated by the same reference numerals, and a redundant description thereof may be omitted.

\<Substrate Processing System 100\>

An example of an overall configuration of a substrate processing system 100 according to one embodiment will be described, with reference to FIG. 1. FIG. 1 is a plan view illustrating the configuration of the example of the substrate processing system 100 according to one embodiment.

The substrate processing system 100 illustrated in FIG. 1 has a cluster structure (or multi-chamber type structure). The substrate processing system 100 includes a plurality of processing chambers 110 (110A through 110F), a vacuum transport chamber 120, a load lock chamber 130, an atmospheric transport chamber 140, load ports 150, and a controller 200.

The processing chambers 110 (110A to 110F) are depressurized to a predetermined vacuum atmosphere, and substrates (or wafers) W are subjected to desired processes (an etching process, a deposition process, a cleaning process, an asking process, or the like) inside the processing chambers 110. The processing chambers 110 are disposed adjacent to the vacuum transport chamber 120. The processing chambers 110 and the vacuum transport chamber 120 communicate with one another by opening and closing a gate valve 119. The processing chamber 110A has a stage (or support) 111 on which the substrate W is placed. The processing chamber 110B has a stage (or support) 112 on which the substrate W is placed. The processing chamber 110A and the processing chamber 110B are arranged side by side on one side surface of the vacuum transport chamber 120, and form a pair of processing chambers 110. The substrates W are simultaneously loaded into and unloaded from the pair of processing chambers 110, by a vacuum transport device 160 that will be described later. Further, the processing chamber 110C includes a stage (or support) 113 on which the substrate W is placed. The processing chamber 110D has a stage (or support) 114 on which the substrate W is placed. The processing chamber 110C and the processing chamber 110D are arranged side by side on one side surface of the vacuum transport chamber 120, and form a pair of processing chambers 110. The processing chamber 110E has a stage (or support) 115 on which the substrate W is placed. The processing chamber 110F has a stage (or support) 116 on which the substrate W is placed. The processing chamber 110E and the processing chamber 110F are arranged side by side on one side surface of the vacuum transport chamber 120, and form a pair of processing chambers 110. An operation of each part for performing the processes in the processing chambers 110 is controlled by the controller 200.

The vacuum transport chamber 120 is connected to a plurality of chambers (the processing chambers 110 and the load lock chamber 130) via the gate valves 119 and 136, and is depressurized to a predetermined vacuum atmosphere. A vacuum transport device 160 configured to transport the substrate W is provided inside the vacuum transport chamber 120. The vacuum transport device 160 includes picks 161 and 162 configured to hold the substrates W. The pick 161 has substrate holding portions 161R and 161L for holding the substrates W, and has a configuration capable of simultaneously transporting two substrates W. Similarly, the pick 162 includes substrate holding portions 162R and 162L for holding the substrates W, and has a configuration capable of simultaneously transporting two substrates W. The vacuum transport device 160 loads and unloads the substrates W between the vacuum transport chamber 120 and the processing chambers 110, according to opening and closing of the gate valves 119. In addition, the vacuum transport device 160 loads and unloads the substrates W between the vacuum transport chamber 120 and the load lock chamber 130, according to opening and closing of the gate valves 136. The operation of the vacuum transport device 160, and the opening and closing of the gate valves 119 and 136, are controlled by the controller 200.

Figure 2:
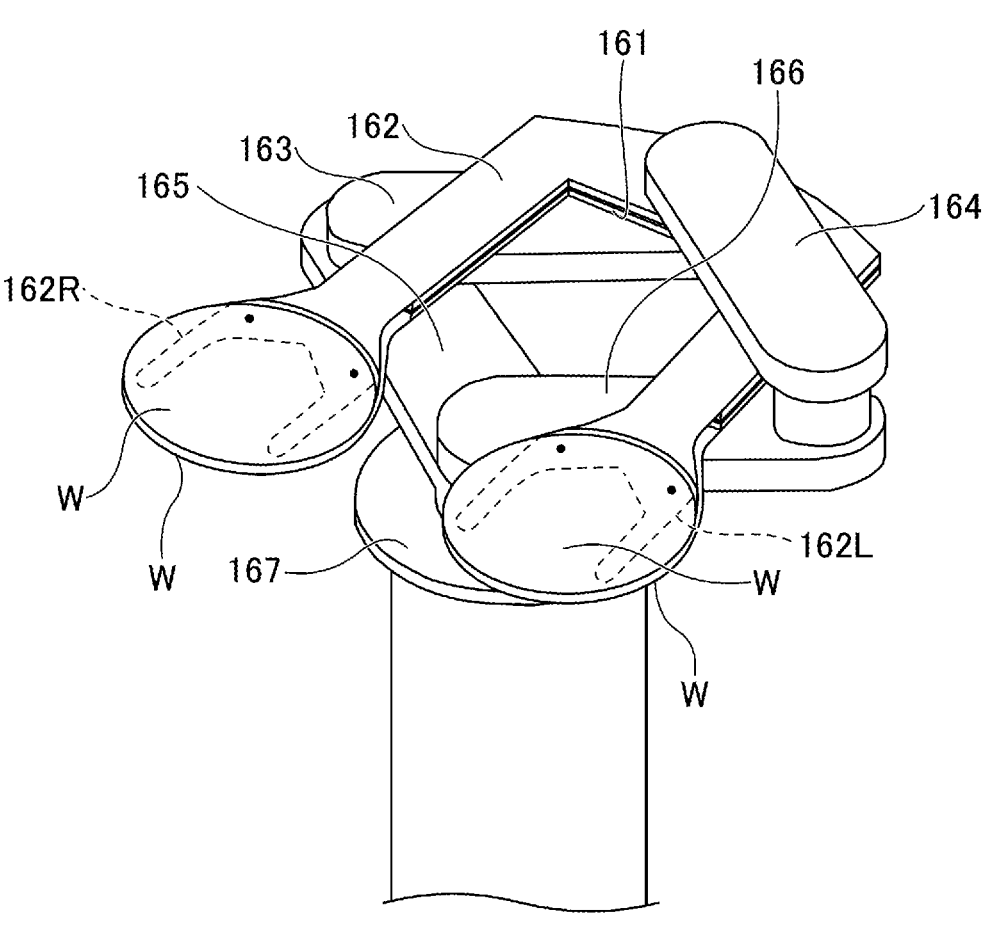
FIG. 2 is a perspective view illustrating an example of a substrate transport device.

Next, an example of the vacuum transport device 160 will be described, with reference to FIG. 2. FIG. 2 is a perspective view illustrating the example of the vacuum transport device 160. The vacuum transport device 160 includes picks 161 and 162, arms 163 through 166, and a base 167. The picks 161 and 162 are arranged in two levels, namely, upper and lower levels, so as to overlap each other, as illustrated in FIG. 2. FIG. 2 illustrates a state where the substrates W are held by the substrate holding portions 161R and 161L (refer to FIG. 1) of the pick 161, and the substrates W are held by the substrate holding portions 162R and 162L of the pick 162.

The pick 161, the arm 163, and the arm 165 form a first arm. One end of the arm 165 is rotatably connected with respect to the base 167. The other end of the arm 165 and one end of the arm 163 are rotatably connected to each other. The other end of the arm 163 and a base of the pick 161 are rotatably connected to each other. The pick 161 branches into two from the base of the pick 161. The substrate holding portion 161R (refer to FIG. 1) is provided in one branch, and the substrate holding portion 161L (refer to FIG. 1) is provided in the other branch. The controller 200 can extend and retract the first arm, and control the position and the direction of the pick 161, by controlling the angle of each joint of the first arm.

Similarly, the pick 162, the arm 164, and the arm 166 form a second arm. One end of the arm 166 is rotatably connected with respect to the base 167. The other end of the arm 166 and one end of the arm 164 are rotatably connected to each other. The other end of the arm 164 and a base of the pick 162 are rotatably connected to each other. The pick 162 branches into two from the base of the pick 162. The substrate holding portion 162R is provided in one branch, and the substrate holding portion 162L is provided in the other branch. The controller 200 can extend and contract the second arm, and control the position and the direction of the pick 162, by controlling the angle of each joint of the second arm.

The base 167 is provided on a floor surface of the vacuum transport chamber 120. In addition, the base 167 includes an elevator mechanism (not illustrated) configured to raise and lower the first arm and the second arm. The controller 200 can raise and lower the first arm and the second arm, by controlling the elevator mechanism.

Returning to the description of FIG. 1, the vacuum transport chamber 120 includes sensors 170 configured to detect the positions of the substrates W held by the picks 161 and 162. The sensors 170 include two photo interrupter sensors with respect to a transport path of one substrate W, for example, and are provided on the front sides of the gate valves 119 and 136. When transporting the substrates W held by the substrate holding portions 161R and 161L of the pick 161 from the vacuum transport chamber 120 to the processing chambers 110 or the load lock chamber 130, the substrates W held by the pick 161 pass through the sensors 170. In this state, each sensor 170 detects an edge of the substrate W that passes through the sensor 170. Hence, it is possible to detect the positions of the substrates W on the pick 161 (relative positions of the substrates W with respect to the pick 161). In other words, it is possible to detect a positional error of the substrate W actually held by each of the substrate holding portions 161R and 161L from a reference holding position of the substrate holding portions 161R and 161L. Similarly, when transporting the substrate W by the pick 162, it is possible to detect a positional error of the substrate W actually held by each of the substrate holding portions 162R and 162L from a reference holding position of the substrate holding portions 162R and 162L.

The load lock chamber 130 is provided between the vacuum transport chamber 120 and the atmospheric transport chamber 140. The load lock chamber 130 includes stages (or supports) 131 to 134 on which the substrates W are placed. The load lock chamber 130 can be switched between an air atmosphere and a vacuum atmosphere. The load lock chamber 130 and the vacuum transport chamber 120 in a vacuum atmosphere communicate with each other by opening and closing the gate valves 136. The load lock chamber 130 and the atmospheric transport chamber 140 in an air atmosphere communicate with each other by opening and closing door valves 137. The switching between the vacuum atmosphere and the air atmosphere in the load lock chamber 130 is controlled by the controller 200.

The stages 131 and 133 are arranged in an up-down direction, and the stages 132 and 134 are similarly arranged in the up-down direction, so that the stages 131 and 132 are located in a lower level, and the stages 133 and 134 are located in an upper level. For this reason, in an actual plan view, the stages 131 and 132, located under the stages 133 and 134, respectively, are not visible due to the stages 133 and 134 overlapping the stages 131 and 132, respectively. However, in order to schematically illustrate each of the stages 131, 132, 133, and 134 in FIG. 1 for the sake of convenience, the stages 131 and 132 are illustrated at positions shifted in a vertical direction on paper in FIG. 1 relative to positions of the stages 133 and 134.

The atmospheric transport chamber 140 is in an air atmosphere, for example, and a downflow of clean air is famed. In addition, an atmospheric transport device 180 that is configured to transport the substrates W is provided inside the atmospheric transport chamber 140. The atmospheric transport device 180 loads and unloads the substrates W between the load lock chamber 130 and the atmospheric transport chamber 140, according to opening and closing of the door valves 137. An operation of the atmospheric transport device 180 and the opening and closing of the door valves 137 are controlled by the controller 200.

Moreover, the load ports 150 are provided on a wall surface of the atmospheric transport chamber 140. A carrier C accommodating the substrate W, or an empty carrier C, is attached to the load ports 150. For example, a front opening unified pod (FOUP) or the like can be used as the carrier C.

The atmospheric transport device 180 can extract the substrate W accommodated in the carrier C attached to the load port 150, and place the substrate W on the stages 131 through 134 of the load lock chamber 130. In addition, the atmospheric transport device 180 can extract the substrate W placed on the stages 131 through 134 of the load lock chamber 130, and accommodate the substrate W in the carrier C attached to the load port 150.

The atmospheric transport device 180 includes a first arm having a first pick 181 configured to hold the substrate W, a second arm having a second pick 182 configured to hold the substrate W, a base (not illustrated), and a slide mechanism (not illustrated). Further, the first pick 181 and the second pick 182 are disposed at different height positions, so that the first pick 181 holding the substrate W and the second pick 182 holding the substrate W can be disposed in two levels, that is, upper and lower levels, so as to overlap each other in the plan view.

The first arm is a selective compliance assembly robot arm (SCARA) type arm, for example, and has one end rotatably connected to the base, and the other end provided with the first pick 181. The controller 200 can extend and contract the first arm, and control the position and direction of the first pick 181, by controlling the angle of each joint of the first arm. Similarly, the second arm is a SCARA type arm, for example, and has one end rotatably connected to the base, and the other end provided with the second pick 182. The controller 200 can extend and contract the second arm, and control the position and direction of the second pick 182, by controlling the angle of each joint of the second arm.

The base includes an elevator mechanism (not illustrated) configured to raise and lower the first arm and the second arm. The controller 200 can raise and lower the first arm and the second arm, by controlling the elevator mechanism.

The slide mechanism is configured to freely move the base in a direction parallel a direction in which the load ports 150 are arranged. The controller 200 can move the first arm, the second arm, and the base in a sliding direction, by controlling the slide mechanism.

The controller 200 includes a central processing unit (CPU), a read only memory (ROM), a random access memory (RAM), and a hard disk drive (HDD). A storage area of the controller 200 is not limited to the HDD, and the storage area may include a solid state drive (SSD) or the like. A recipe set with process procedures, process conditions, and transport conditions, is stored in a storage area, such as the HDD, the RAM, or the like.

The CPU controls the processes on the substrate W in each processing chamber 110 according to the recipe, and controls the transport of the substrate W. The HDD or the RAM may store a program which, when executed by the CPU (or computer), causes the CPU to perform the processes on the substrate W and the transport of the substrate W in each processing chamber 110. The program may be provided in a state stored in a storage medium, or may be provided from an external device through a network.

FIG. 3 is a flow chart for explaining an example of an operation of the substrate processing system 100.

In step S101, the controller 200 detects a relative positional error at the stage of each of the processing chambers 110 (110A through 110F). FIG. 5 is diagram illustrating an example of a table stored in the ROM or the like of the controller 200.

In this example, the substrate W is placed at a center position of the stage 111 in the processing chamber 110A. The controller 200 controls the vacuum transport device 160, to receive the substrate W placed on the stage 111 by the substrate holding portion 161R of the pick 161, and unload the substrate W from the processing chamber 110A. In this state, the position of the substrate W on the pick 161

(a relative position of the substrate W with respect to the pick 161) is detected by the sensor 170 provided on the front side of the gate valve 119 of the processing chamber 110A. Accordingly, the positional error of the position of the substrate W actually held by the substrate holding portion 161R, with respect to the reference holding position of the substrate holding portion 161R, is detected.

Next, the substrate W is placed at a center position of the stage 133 of the load lock chamber 130. The controller 200 controls the vacuum transport device 160, to receive the substrate W placed on the stage 133 by the substrate holding portion 161R of the pick 161, and transport the substrate W from the load lock chamber 130 to the processing chamber 110A. In this state, the position of the substrate W on the pick 161 (a relative position of the substrate W with respect to the pick 161) is detected by the sensor 170 provided on the front side of the gate valve 119 of the processing chamber 110A. Accordingly, the positional error of the position of the substrate W actually held by the substrate holding portion 161R, with respect to the reference holding position of the substrate holding portion 161R, is detected.

Then, based on the detected positional errors, a relative positional error (a positional error $A_{31}$ in an X-direction and a positional error $B_{31}$ in a Y-direction) of the stage 111 in the processing chamber 110A with respect to the center position of the stage 133, is computed. In other words, the error between the center position of the stage 111 and the substrate W placed thereon, when the substrate W placed at the center position of the stage 133 is transported from the stage 133 to the stage 111 by the vacuum transport device 160, is computed. For example, the X-direction may be a horizontal direction that is a width direction of an opening of the door valve 137, the Y-direction may be the horizontal direction that is a penetrating direction of the opening of the door valve 137, and a Z-direction may be the height direction (or vertical direction). In addition, a positional error $C_{31}$ in the Z-direction may be 0. The X-direction, the Y-direction, and the Z-direction extend along an X-axis, a Y-axis, and a Z-axis of an XYZ coordinate system, respectively. Hence, the X-direction, the Y-direction, and the Z-direction are perpendicular to one another.

Similarly, a relative positional error (a positional error $A_{32}$ in the X-direction, a positional error $B_{32}$ in the Y-direction, and a positional error $C_{32}$ in the Z-direction) of the stage 113 in the processing chamber 110C with respect to the center position of the stage 133, is computed. In addition, a relative positional error (a positional error $A_{33}$ in the X-direction, a positional error $B_{33}$ in the Y-direction, and a positional error $C_{33}$ in the Z-direction) of the stage 115 in the processing chamber 110E with respect to the center position of the stage 133, is computed. Moreover, a relative positional error (a positional error $A_{41}$ in the X-direction, a positional error $B_{41}$ in the Y-direction, and a positional error $C_{41}$ in the Z-direction) of the stage 112 in the processing chamber 110B with respect to the center position of the stage 134, is computed. Further, a relative positional error (a positional error $A_{42}$ in the X-direction, a positional error $B_{42}$ in the Y-direction, and a positional error Cu in the Z-direction) of the stage 114 in the processing chamber 110D with respect to the center position of the stage 134, is computed. In addition, a relative positional error (a positional error $A_{43}$ in the X-direction, a positional error $B_{43}$ in the Y-direction, and a positional error Cu in the Z-direction) of the stage 112 in the processing chamber 110F with respect to the center position of the stage 134, is computed. The computed positional errors described heretofore can be stored in the table illustrated in FIG. 5, for example.

In step S102, the controller 200 computes placement positions of the substrates W on the stages 133 and 134 in the load lock chamber 130, based on the transport path of the substrate W. In this case, the transport path refers to a path in which the substrate W is transported from the carrier C to the load lock chamber 130, and transported to one or the plurality of processing chambers 110, and the processed substrate W is returned to the load lock chamber 130, and returned to the carrier C. A method for computing the placement positions of the substrates W on the stages 133 and 134 based on the transport path of the substrate W, will be described later with reference to a flow chart of FIG. 4.

In step S103, the controller 200 controls the atmospheric transport device 180 to transport the substrate W from the carrier C to the load lock chamber 130. In this state, the controller 200 places the substrates W on the stages 133 and 134, based on the placement positions on the stages 133 and 134 computed in step S102.

In step S104, the controller 200 controls the vacuum transport device 160 to transport the substrate W from the load lock chamber 130 to the processing chamber 110. In this state, the controller 200 transports the substrate W to one or the plurality of processing chambers 110, based on the transport path of the substrate W.

In step S105, the controller 200 controls the processing chambers 110 to perform the processes on the substrate W.

In step S106, the controller 200 determines whether or not all processes on the substrate W ended. When not all processes on the substrate W ended (NO in step S106), the process of the controller 200 returns to step S104, and based on the transport path of the substrate W, the substrate W is transported to the next processing chamber 110 (step S104), and next processes are performed on the substrate W (step S105). When all processes on the substrate W ended (YES in step S106), the process of the controller 200 advances to step S107.

In step S107, the controller 200 controls the vacuum transport device 160 to transport the processed substrate W from the processing chamber 110 to the load lock chamber 130.

In step S108, the controller 200 controls the atmospheric transport device 180 to accommodate the substrate W from the load lock chamber 130 into the carrier C.

Next, the method for computing the placement positions on the stages 133 and 134 in step S102 will be described, with reference to FIG. 4. FIG. 4 is a flow chart illustrating an example of an operation of the substrate processing system 100.

In step S201, the controller 200 acquires the transport path of the substrate W. Examples of the transport path include a transport path through which the substrate W is transported to one processing chamber 110 and thereafter transported to another processing chamber 110 (that is, serial transport is made), a transport path through which the substrate W is transported to a fixed processing chamber 110, a transport path through which the substrate W is transported to one processing chamber 110 among the plurality of processing chambers 110 (that is, an OR transport is made), or the like, for example.

In step S202, the controller 200 determines whether or not the transport path of the substrate W is a path in which the serial transport (or crossover transport) is made. In the case where the serial transport is made (YES in step S202), the process of the controller 200 advances to step S204. On the other hand, in the case where serial transport is not made (NO in step S202), the process of the controller 200 advances to step S203.

In step S203, the controller 200 determines whether or not the transport path of the substrate W is a path in which the substrate W is transported to the fixed processing chamber 110. In the case where the substrate W is transported to the fixed processing chamber 110 (YES in step S203), the process of the controller 200 advances to step S205. On the other hand, in the case where the transport path of the substrate W is a path in which the substrate W is transported to one processing chamber 110 among the plurality of processing chambers 110 by the OR transport (NO in step S203), the process of the controller 200 advances to step S206.

In step S204, the controller 200 computes the placement position based on an average value of the relative positional errors of the processing chambers 110 associated with the serial transport. For example, when the substrate W is serially transported to the processing chamber 110A and the processing chamber 110B, a correction amount of the placement position (relative positional error) of the load lock chamber 130 is computed, based on the average value of the relative positional error of the processing chamber 110A and the relative positional error of the processing chamber 110B.

That is, the correction amount of the stage 133 in the load lock chamber 130 can be represented by $((A_{31}+A_{32})/2,$ $(B_{31}+B_{32})/2,$ $(C_{31}+C_{32})/2)$. The correction amount of the stage 134 in the load lock chamber 130 can be represented by $((A_{41}+A_{42})/2,$ $(B_{41}+B_{42})/2,$ $(C_{41}+C_{42})/2)$.

Accordingly, when the atmospheric transport device 180 places the substrate W on the stage 133 (refer to step S103), the substrate W is placed at the placement position corrected by the correction amount $((A_{31}+A_{32})/2,$ $(B_{31}+B_{32})/2,$ $(C_{31}+C_{32})/2)$ from the center position of the stage 133. Similarly, when the atmospheric transport device 180 places the substrate W on the stage 134 (refer to step S103), the substrate W is placed at the placement position corrected by the correction amount $((A_{41}+A_{42})/2,$ $(B_{41}+B_{42})/2,$ $(C_{41}+C_{42})/2)$ from the center position of the stage 134.

In step S205, the controller 200 computes the placement position based on the relative positional error of a predetermined processing chamber 110. When transporting the substrate W to the processing chamber 110A, for example, the correction amount (relative positional error) of the load lock chamber 130 is computed, based on the relative positional error of the processing chamber 110A.

That is, the correction amount of the stage 133 in the load lock chamber 130 can be represented by $(A_{31}, B_{31}, C_{31})$. The correction amount of the stage 134 in the load lock chamber 130 can be represented by $(A_{41}, B_{41}, C_{41})$.

Hence, when the atmospheric transport device 180 places the substrate W on the stage 133 (refer to step S103), the substrate W is placed at the placement position corrected by the correction amount $(A_{31}, B_{31}, C_{31})$ from the center position of the stage 133. Similarly, when the atmospheric transport device 180 places the substrate W on the stage 134 (refer to step S103), the substrate W is placed at the placement position corrected by the correction amount $(A_{41}, B_{41}, C_{41})$ from the center position of the stage 134.

In step S206, the controller 200 computes the placement position, based on the average value of the relative positional errors of the plurality of processing chambers 110 that are candidates to which the transport is made. For example, when transporting the substrate W to one processing chamber 110 among the processing chamber 110A, the processing chamber 110B, and the processing chamber 110C, the correction amount (relative positional error) of the load lock chamber 130 is computed, based on the average value of the relative positional error of the processing chamber 110A, the relative positional error of the processing chamber 110B, and the relative positional error of the processing chamber 110C.

That is, the correction amount of the stage 133 in the load lock chamber 130 can be represented by $((A_{31}+A_{32}+A_{33})/3,$ $(B_{31}+B_{32}+B_{33})/3, (C_{31}+C_{32}+C_{33})/3)$. The correction amount of the stage 134 in the load lock chamber 130 can be represented by $(A_{41}+A_{42}+A_{43})/3, (B_{41}+B_{42}+B_{43})/3, (C_{41}+C_{42}+C_{43})/3)$.

Accordingly, when the atmospheric transport device 180 places the substrate W on the stage 133 (refer to step S103), the substrate W is placed at the placement position corrected by the correction amount $((A_{31}+A_{32}+A_{33})/3, (B_{31}+B_{32}+B_{33})/3, (C_{31}+C_{32}+C_{33})/3)$ from the center position of the stage 133. Similarly, when the atmospheric transport device 180 places the substrate W on the stage 134 (refer to step S103), the substrate W is placed at the placement position corrected by the correction amount $(A_{41}+A_{42}+A_{43})/3, (B_{41}+B_{42}+B_{43})/3, (C_{41}+C_{42}+C_{43})/3)$ from the center position of the state 134.

In addition, in step S206, when a failure or the like occurs in the processing chamber 110A, and the processing chamber 110 that is the candidate to which the transport is made is one of the processing chamber 110B and the processing chamber 110C, for example, the correction amount (relative positional error) of the load lock chamber 130 is computed, based on the average value of the relative positional error of the processing chamber 110B and the relative positional error of the processing chamber 110C. Hence, it is possible to improve the correction accuracy.

That is, the correction amount of the stage 133 in the load lock chamber 130 can be represented by $((A_{32}+A_{33})/2, (B_{32}+B_{33})/2, (C_{32}+C_{33})/2)$. The correction amount of the stage 134 in the load lock chamber 130 can be represented by $((A_{42}+A_{43})/2, (B_{42}+B_{43})/2, (C_{42}+C_{43})/2)$.

Thus, when the atmospheric transport device 180 places the substrate W on the stage 133 (refer to step S103), the substrate W is placed at the placement position corrected by the correction amount $((A_{32}+A_{33})/2, (B_{32}+B_{33})/2, (C_{32}+C_{33})/2)$ from the center position of the stage 133. Similarly, when the atmospheric transport device 180 places the substrate W on the stage 134 (refer to step S103), the substrate W is placed at the placement position corrected by the correction amount $((A_{42}+A_{43})/2, (B_{42}+B_{43})/2, (C_{42}+C_{43})/2)$ from the center position of the stage 134.

Steps S204 through S206 can acquire the relative positional errors used for the computation, from the table illustrated in FIG. 5, for example. The process ends after any of steps S204 through S206.

The vacuum transport device 160 of the substrate processing system 100 is configured to simultaneously transport a plurality of substrates (in this example, two substrates) W. For this reason, the plurality of substrates W can be simultaneously transported from one of the stages (for example, the stages 133 and 134) to the other of the stages (for example, the stages 111 and 112) while maintaining the relative positional relationship of the plurality of substrates W that are simultaneously transported.

In addition, in the substrate processing system 100, the positional relationship between the stages 111 and 112 in the processing chambers 110A and 110B, the positional relationship between the stages 113 and 114 in the processing chambers 110C and 110D, and the positional relationship between the stages 115 and 116 in the processing chambers 110E and 110F, may differ due to assembly errors.

On the other hand, in the substrate processing system 100 according to one embodiment, it is possible to dynamically switch the correction amount when the atmospheric transport device 180 places the substrates W on the stages 133 and 134 in the load lock chamber 130, according to the state of the device or the transport path of the substrate W. Accordingly, it is possible to improve the positional accuracy of the substrates W on the stages in the processing chambers 110, compared to a configuration in which the substrate W is placed at predetermined positions on the stages 133 and 134.

In addition, the substrate processing system 100 according to one embodiment can simplify the transport process by the vacuum transport device 160. Accordingly, it is possible to improve a throughput of the substrate processing system 100, and to improve a productivity of the substrate processing system 100.

Although the table illustrated in FIG. 5 stores the correction amount or the relative positional error of the stage in each processing chamber 110 with respect to the center position of the stages 133 and 134, the content of the table is not limited to the correction amount or the relative positional error. For example, the table may store a control position of the atmospheric transport device 180 (for example, coordinates of reference positions of the picks 181 and 182) when transporting the substrate W to the stages 133 and 134. The reference position of the pick 181 may be a center position of the substrate W in a state where substrate W is held by the pick 181 at a correct position, for example. Similarly, the reference position of the pick 182 may be the center position of the substrate W in a state where the substrate W is held by the pick 182 at the correct position, for example.

According to one aspect of the present disclosure, it is possible to provide a substrate transport method, and a substrate processing system including transport devices configured to simultaneously transport a plurality of substrates, that can transport the plurality of substrates by correcting a positional error of the plurality of substrates.

Although the substrate processing system 100 is described above, the present disclosure is not limited to the above described embodiments or the like, and various variations, modifications, and substitutions may be made without departing from the scope of the present disclosure.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate transport method for a substrate processing system including a plurality of processing chambers, a load lock chamber, a vacuum transport device provided in a vacuum transport chamber connecting the load lock chamber and the plurality of processing chambers and configured to simultaneously transport a plurality of substrates, and an atmospheric transport device provided in an atmospheric transport chamber and configured to transport a substrate from a carrier to the load lock chamber, the substrate transport method comprising:

acquiring in advance a relative positional error between a center position of one substrate placed on a first stage in one processing chamber among the plurality of processing chambers with respect to a center position of the first stage in the one processing chamber for a case where the plurality of substrates are transported from the load lock chamber to the plurality of processing chambers and placed on respective first stages in the plurality of processing chambers; and placing the plurality of substrates on respective second stages in the load lock chamber, based on a transport path of the plurality of substrates and the relative positional error.

2. The substrate transport method as claimed in claim 1, wherein the acquiring acquires in advance the relative positional error between the center position of each substrate among the plurality of substrates with respect to the center position of each first stage in each processing chamber among the plurality of processing chambers.

3. The substrate transport method as claimed in claim 2, wherein in a case where the transport path transports the plurality of substrates between one processing chamber among the plurality of processing chambers and another processing chamber among the plurality of processing chambers, the placing places the plurality of substrates on the respective second stages in the load lock chamber, based on an average value of relative positional errors between center positions of the plurality of substrates with respect to center positions of first stages in the plurality of processing chambers to which the plurality of substrates are transported.

4. The substrate transport method as claimed in claim 2, wherein in a case where the transport path transports the plurality of substrates to one fixed processing chamber among the plurality of processing chambers, the placing places the plurality of substrates on the respective second stages in the load lock chamber, based on relative positional errors between center positions of the plurality of substrates with respect to center positions of first stages in the plurality of processing chambers to which the plurality of substrates are transported.

5. The substrate transport method as claimed in claim 2, wherein in a case where the transport path transports the plurality of substrates to one processing chamber among the plurality of processing chambers, the placing places the plurality of substrates on the respective second stages in the load lock chamber, based on an average value of the relative positional errors between center positions of the plurality of substrates with respect to center positions of first stages in multiple processing chambers that are candidates to which the plurality of substrates are transported among the plurality of processing chambers.

6. The substrate transport method as claimed in claim 1, wherein the atmospheric transport device transports the plurality of substrates one by one.

7. A substrate processing system comprising:

a plurality of processing chambers;

a load lock chamber;

a vacuum transport device, provided in a vacuum transport chamber connecting the load lock chamber and the plurality of processing chambers, and configured to simultaneously transport a plurality of substrates; and an atmospheric transport device, provided in an atmospheric transport chamber, and configured to transport a substrate from a carrier to the load lock chamber; and a controller configured to perform a process including:

acquiring in advance a relative positional error between a center position of one substrate placed on a first stage in one processing chamber among the plurality of processing chambers with respect to a center position of the first stage in the one processing chamber for a case where the plurality of substrates are transported from the load lock chamber to the plurality of processing chambers and placed on respective first stages in the plurality of processing chambers; and placing the plurality of substrates on respective second stages in the load lock chamber, based on a transport path of the plurality of substrates and the relative positional error.

8. The substrate processing system as claimed in claim 7, wherein the transport path is selected from a group consisting of a transport path through which the plurality of substrates are transported to the one processing chamber and thereafter transported to another processing chamber among the plurality of processing chambers by a serial transport, a transport path through which the plurality of substrates are transported to one fixed processing chamber among the plurality of processing chambers, and a transport path through which the plurality of substrates are transported to the one processing chamber.

9. The substrate transport method as claimed in claim 1, wherein the transport path is selected from a group consisting of a transport path through which the plurality of substrates are transported to the one processing chamber and thereafter transported to another processing chamber among the plurality of processing chambers by a serial transport, a transport path through which the plurality of substrates are transported to one fixed processing chamber among the plurality of processing chambers, and a transport path through which the plurality of substrates are transported to the one processing chamber.

\* \* \* \* \*